United States Patent
Gorbold et al.

(10) Patent No.: US 10,200,041 B2
(45) Date of Patent: Feb. 5, 2019

(54) ANALOG MULTIPLEXER

(71) Applicants: Jeremy R. Gorbold, Newbury (GB);
Christian Steffen Birk, Bandon (IE);
Gerard Mora Puchalt, Catarroja (ES);
Colin Charles Price, Berks (GB);
Michael C. W. Coln, Lexington, MA (US); Mahesh Madhavan Kumbaranthodiyil, Kerala (IN)

(72) Inventors: Jeremy R. Gorbold, Newbury (GB);
Christian Steffen Birk, Bandon (IE);
Gerard Mora Puchalt, Catarroja (ES);
Colin Charles Price, Berks (GB);
Michael C. W. Coln, Lexington, MA (US); Mahesh Madhavan Kumbaranthodiyil, Kerala (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/340,423

(22) Filed: Nov. 1, 2016

(65) Prior Publication Data
US 2018/0123591 A1    May 3, 2018

(51) Int. Cl.
*H03K 17/00* (2006.01)
*H03K 19/0185* (2006.01)
*H03K 17/693* (2006.01)

(52) U.S. Cl.
CPC ... *H03K 19/018507* (2013.01); *H03K 17/693* (2013.01)

(58) Field of Classification Search
None
See application file for complete search history.

(56) References Cited

U.S. PATENT DOCUMENTS

| 5,235,333 A | * | 8/1993 | Naylor | H03M 1/06 341/118 |
|---|---|---|---|---|
| 7,952,419 B1 | | 5/2011 | Birk | |
| 8,222,948 B2 | | 7/2012 | Birk | |

(Continued)

OTHER PUBLICATIONS

"Circuit Note", One Technology Way, P.O. Box 9106, Norwood, MA 02062-9106, U.S.A. Tel: 781.329.4700 www.analog.com—Fax: 781.461.3113 © 2011 Analog Devices, Inc. All rights reserved (Jan. 1, 2011), 5 pgs.

(Continued)

*Primary Examiner* — Long Nguyen
(74) *Attorney, Agent, or Firm* — Schwegman Lundberg & Woessner, P.A.

(57) ABSTRACT

An analog multiplexer may be used for sampling an input voltage that is capable of having a higher voltage level than an upper supply voltage. The analog multiplexer includes a plurality of input switch circuits and a shorting switch circuit. The plurality of input switch circuits include n-type or p-type laterally diffused field effect transistors (NLDFETs or PLDFETs). At least one of the input switch circuits includes a level shifting switch circuit that is able to sample an input voltage that is greater than the upper supply voltage for the multiplexer. A shorting switch circuit, at an output of the multiplexer, includes a capacitively coupled gate drive circuit and is configured to short a first differential output to a second differential output after the input voltage is sampled.

20 Claims, 10 Drawing Sheets

(56) References Cited

U.S. PATENT DOCUMENTS 8,604,862 B2    12/2013  Birk et al.
9,645,201 B2 *   5/2017  Song .................. G01R 31/3658

OTHER PUBLICATIONS

"Lithium Ion Battery Monitoring System", One Technology Way, P.O. Box 9106, Norwood, MA 02062-9106, U.S.A.—Tel: 781.329.4700 www.analog.com—Fax: 781.461.3113 © 2011 Analog Devices, Inc. All rights reserved (Jan. 1, 2011), 49 pgs.

* cited by examiner

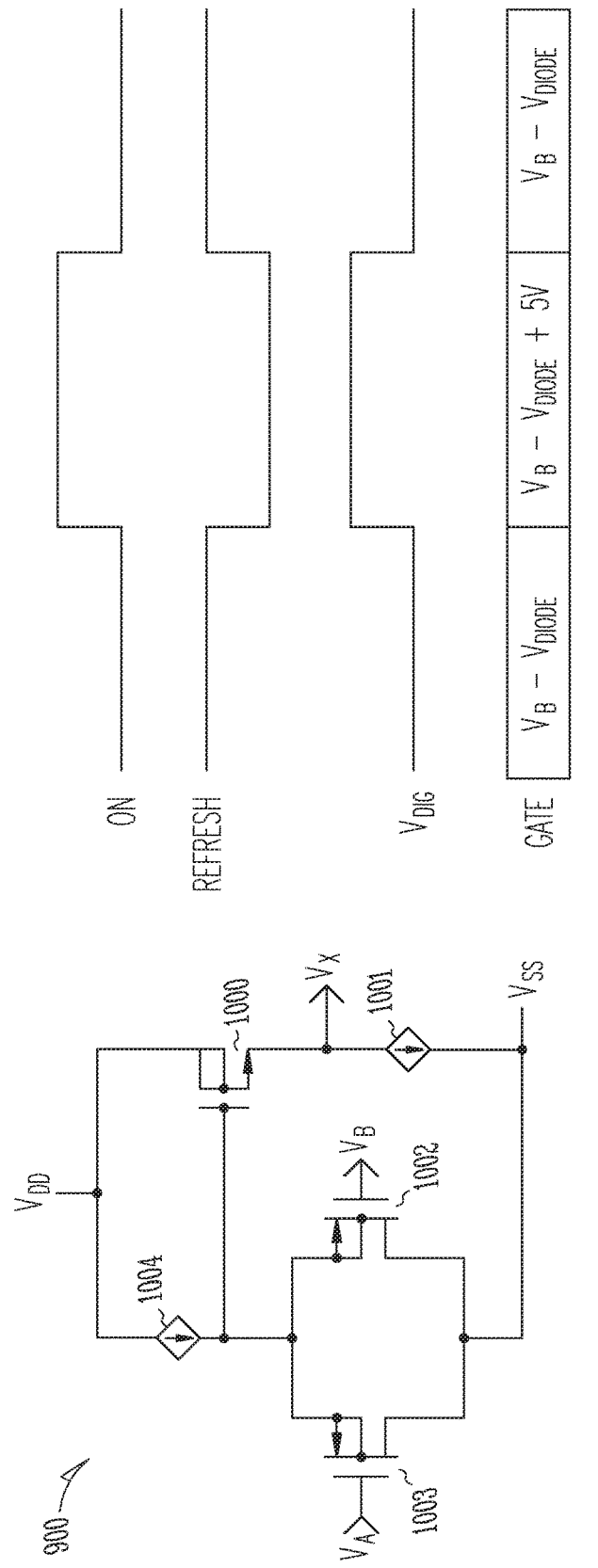

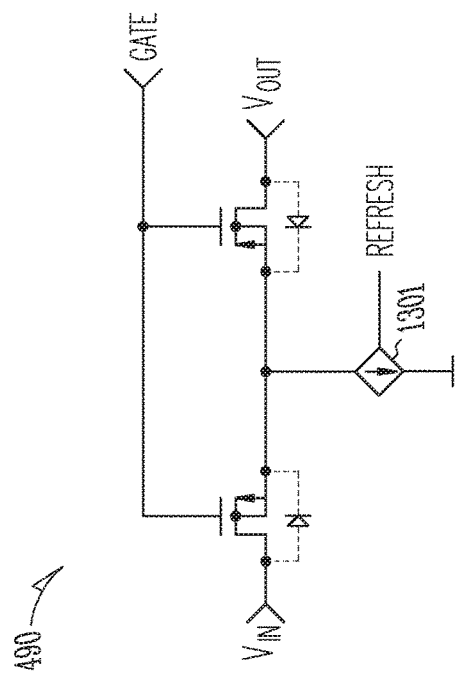
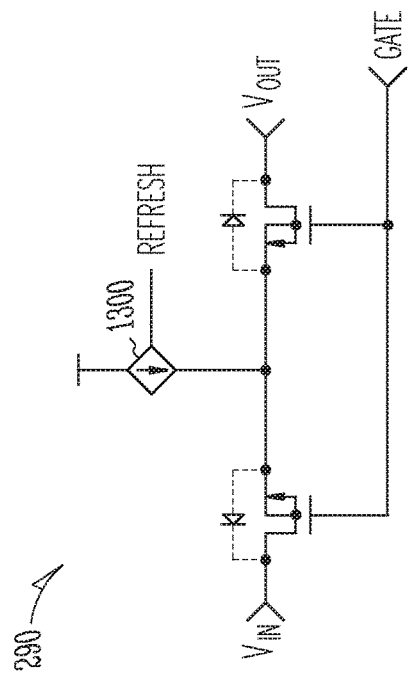
Fig. 13

ANALOG MULTIPLEXER

FIELD OF THE DISCLOSURE

This document pertains generally, but not by way of limitation, to the field of integrated circuits and, in particular, to analog multiplexing circuits.

BACKGROUND

An analog multiplexer includes circuitry to switch a selected one of a plurality of input analog signal channels (e.g., input voltages) into a single output analog signal channel (e.g., output voltage). The analog multiplexers can include a plurality of input sampling circuits, each associated with a respective one of the input analog signal channels.

One type of switch is disclosed in U.S. Pat. No. 8,604,862 to Christian Birk et al. This patent discloses a bootstrapped switch circuit having a first transistor to receive an input signal and a second transistor to provide an output signal.

SUMMARY OF THE DISCLOSURE

The present inventors have recognized, among other things, a need for an analog multiplexer capable of sampling a voltage that is greater than a supply voltage. This document relates generally to analog multiplexing circuits and, in particular, to sampling of voltages greater than a supply voltage.

An analog multiplexer may be used for sampling an input voltage that is capable of having a higher voltage level than an upper supply voltage. The analog multiplexer includes a plurality of input switch circuits. Each input switch circuit is coupled between a respective input and one of a first or a second differential output. At least one of the plurality of input switch circuits includes a level shifting switch circuit that is configured to sample the input voltage capable of having the higher voltage level than the upper supply voltage. A shorting switch circuit is coupled between the first and second differential outputs. The shorting switch circuit includes a capacitively coupled gate drive circuit and is configured to short the first differential output to the second differential output after the input voltage is sampled.

A shorting switch circuit for connecting a first differential output to a second differential output may be used in the analog multiplexer when a voltage level on each of the first and second differential outputs is unknown. The shorting switch circuit includes a plurality of laterally diffused field effect transistors (LDFETs), a first LDFET having a drain coupled to a first voltage node and a source coupled to a source of a second LDFET. A drain of the second LDFET is coupled to a second voltage node. A gate driver circuit is coupled to the gates of the first and second LDFETs. The gate driver circuit includes a voltage selector circuit having inputs coupled to the first and second voltage nodes, a voltage drop element coupled between an output of the voltage selector circuit and a gate output, a control signal coupled to the gate output through a capacitance, and a current source coupled between the gate output and a supply node.

A level shifting switch circuit for sampling an input voltage capable of having a higher voltage level than an upper supply voltage may be used in the analog multiplexer. The level shifting switch circuit includes a current level shifting circuit coupled to an input voltage node and an upper supply voltage. The level shifting circuit further includes a set input, a reset input, an elevated ground, and a gate output. A transistor has a source coupled to the input voltage node, a drain coupled to an output voltage node, and a gate coupled to the gate output. A voltage drop element is coupled between the upper supply voltage and the elevated ground of the current level shifting circuit. A first current source is coupled between the elevated ground and a lower supply voltage. A first switch is coupled between the set input and a second current source. A second switch is coupled between the reset input and the second current source, wherein the second current source is further coupled to the lower supply voltage.

A method for using the analog multiplexer includes sampling an input voltage capable of having a higher voltage level than an upper supply voltage. The method includes activating (e.g., turning on) a level shifting switch circuit between a first input voltage node and a first differential output terminal. The first input voltage node comprises the input voltage having a higher voltage level than the upper supply voltage. An input switch circuit is activated (e.g., turned on) between a second input voltage node and a second differential output terminal. The first differential output terminal is connected to the second differential output terminal after the input voltage is sampled.

This section is intended to provide an overview of the subject matter of the present patent application. It is not intended to provide an exclusive or exhaustive explanation of the invention. The detailed description is included to provide further information.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 10 is a schematic diagram of an adaptive voltage selector circuit, such as in accordance with the driver circuit of FIG. 9.

FIG. 11 is a timing diagram of switch operation, such as in accordance with the shorting switch circuit of FIG. 8.

FIG. 13 are schematic diagrams of the NLDFET and PLDFET input switch circuits with refresh biasing circuitry, such as in accordance with various embodiments.

DETAILED DESCRIPTION

A high voltage (e.g., >5V) analog multiplexer (HVMUX) can provide a switching function by selecting between a plurality of differential input voltages, that can vary between 0V and some maximum voltage (e.g., 60V), and outputting the sampled differential voltage. The multiplexer can be used in various voltage sampling scenarios, such as sampling voltages of a stack of batteries.

In order to be able to sample all of the voltages of the battery stack, the multiplexer supply voltage should be at least as high as the maximum voltage being sampled by the multiplexer. However, a problem occurs when this maximum voltage, from the top battery of the series-connected stack of batteries being sampled, is also used as an upper supply voltage (e.g., $V_{DD}$) for the multiplexer. Any resistance between the top battery and the multiplexer results in a voltage drop across the resistance. The supply voltage to the multiplexer is reduced by this voltage drop. Thus, the supply voltage for the multiplexer can end up being less than the maximum voltage being sampled. Using a level shifting switch circuit, the analog multiplexer is able to sample voltages that are greater than a circuit supply voltage.

As one example of operation, an electric car might have a plurality of 5V batteries connected in a series configuration. It is desirable for the battery controller circuits to know the status (e.g., state of charge) of each battery as well as the total battery stack voltage. Instead of having a voltage sampling circuit for each battery, the multiplexer is able to sample each battery as a differential voltage. For example, the first battery differential voltage might go from 0V to 5V, the second battery differential voltage might go from 5V to 10V, the third battery differential voltage might go from 10V to 15V. This continues for the entire stack of batteries. In such an application, the multiplexer can be used to select and sample one of these battery differential voltage ranges and output that differential voltage to another circuit, such as an analog-to-digital converter (ADC). The ADC converts the sampled analog voltage to a digital representation of that voltage. The digital representation can then be used in a battery controller or other circuit.

Figure 1:
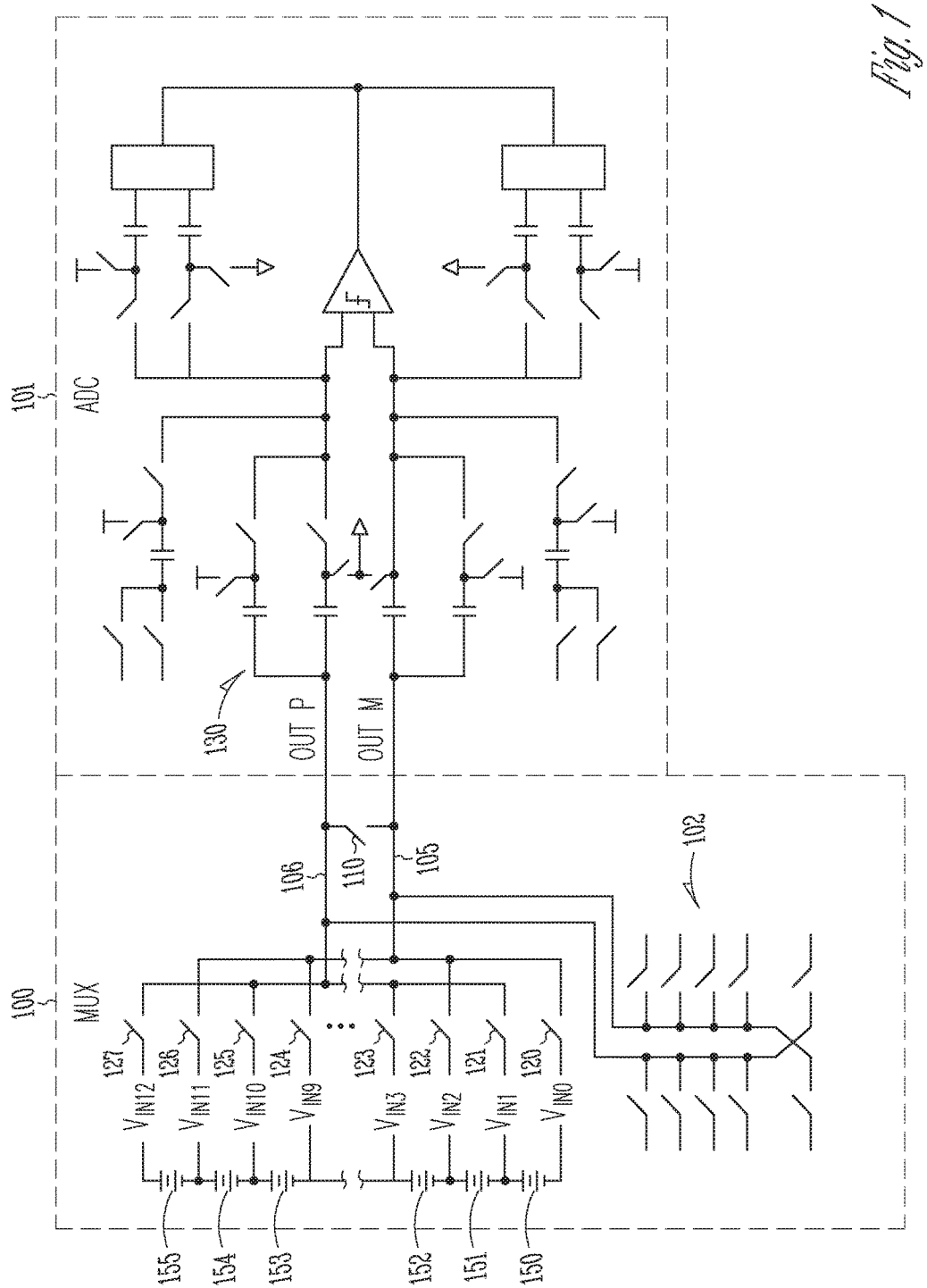
FIG. 1 is a schematic diagram of an analog multiplexer in an example system, such as in accordance with various embodiments.

FIG. 1 is a schematic diagram of an analog multiplexer 100 in an example system such as can include a multiplexer 100, an ADC 101, a plurality of batteries 150-155, and a set of alternate input switches 102. The analog multiplexer can include a plurality of input switch circuits 120-127, a shorting switch circuit 110, differential outputs 104, 106, and a set of alternate input switches 102.

The multiplexer 100 is shown coupled to the batteries 150-155 and the ADC 101 for purposes of illustration of only one example use of the multiplexer 100. The multiplexer 100 may be used in other implementations. The embodiment illustrated in FIG. 1 may be used to sample battery differential voltages and output each respective battery differential voltage, such as to the shared ADC to be converted into a digital representation of the battery voltage.

A first set of input switch circuits 120, 122, 125, 127 can be coupled between a respective input voltage (e.g., $V_{IN0}$, $V_{IN2}$, $V_{IN10}$, $V_{IN12}$) and a first differential output 105. A second set of input switch circuits 121, 123, 124, 126 can be coupled between a respective input voltage (e.g., $V_{IN1}$, $V_{IN3}$, $V_{IN9}$, $V_{IN11}$) and a second differential output 106.

As will be discussed subsequently in greater detail, the plurality of input switch circuits 120-127 can include at least two different types of input switch circuits: a p-type or n-type input switch circuit and a level shifting input switch circuit. At least one of the plurality of input switch circuits can be the level shifting switch circuit that is configured to sample the input voltage capable of having a higher voltage level than the upper supply voltage.

In an embodiment, the ADC 101 may be a 5V supply device and, thus, may be unable to handle the higher voltages (e.g., 60V) from the analog multiplexer 100. The shorting switch circuit 110, coupled between the first differential output 105 and the second differential output 106, can short the first differential output 105 to the second differential output 106 when the shorting switch circuit 110 is activated such as after input voltage sampling has been completed. This transfers the differential output voltage to the input of the ADC 101.

As described subsequently with reference to the method of FIG. 14, the shorting switch circuit 110 may be activated to short the differential outputs 105, 106 after sampling one of the input voltages and opening of the input switch circuits 120-127. In an embodiment, the shorting switch circuit 110 can comprise a third different type of switch as compared to the input switch circuits 120-127.

The set of alternate input switches 102 can be coupled to the differential outputs 105, 106 and can provide a way to couple lower voltages to the differential outputs 105, 106. For example, the set of alternate input switches 102 may be used to sample voltages less than 5V. In an embodiment, the set of alternate input switches 102 uses different types of input switches than those described herein.

In the embodiment implementing the stack of series-connected plurality of batteries, the level shifting input switch circuit can be coupled to an end battery in the series-connected plurality of batteries. Thus, the level shifting switch circuit can experience the highest voltage of the plurality of input switch circuits. Each of the remaining input switch circuits can be coupled to a respective node either between a pair of adjacent batteries or at the last battery of the battery stack.

The following descriptions of the various switch embodiments refer to metal oxide semiconductor field effect transistors (MOSFETs). However, the "MOS" reference is for purposes of illustration only as there is no requirement that any embodiment use either metal or oxide. For example, other embodiments may use other materials besides metal as a conductive gate material or oxide as a gate insulative material (e.g., nitride).

Figure 2:
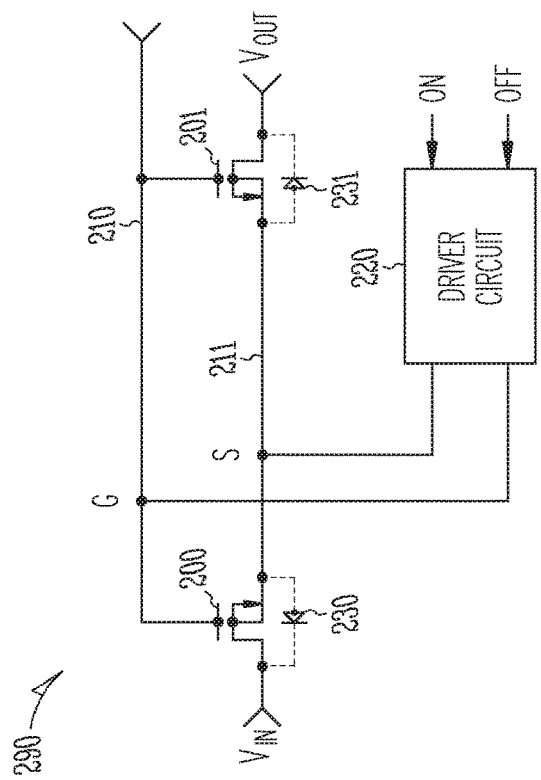
FIG. 2 is a schematic diagram of an n-laterally diffused field-effect transistor (NLDFET) input switch circuit, such as in accordance with various embodiments.

FIG. 2 is a schematic diagram of an n-laterally diffused field-effect transistor (NLDFET) input switch circuit, in accordance with various embodiments. In an embodiment, these switches are NLDMOS switches.

As shown in FIG. 2, the switch circuit may include a first transistor 200, a second transistor 201, and a driver circuit 220. The transistors 200, 201 may be NLDFETs (e.g., NLDMOS transistors). The transistors 200, 201 can have their back gates connected to their sources, but are not so limited. The transistors 200, 201 are illustrated with diodes 230, 231 shown in phantom to depict the biasing that allows current to flow from the source/back gate terminal to the drain terminal of each of the transistors 200, 201. Specifically, when the sources of the transistors 200, 201 are at a higher potential than their respective drains, the body diode 230, 231 (PN junction formed by the back gate and the drain) is forward biased, allowing current to flow from the source/back gate terminals to the drain terminals.

As shown in FIG. 2, the drain of the first transistor 200 may be configured to be an input terminal (e.g., $V_{IN}$) and the drain of the second transistor 201 may be configured to be an output terminal (e.g., $V_{OUT}$). The gates 210 of the transistors 200, 201 may be coupled to each other. Similarly, the sources 211 of the transistors 200, 201 can be coupled to each other. The driver circuit 220 may be coupled between the connected sources 211 and the connected gates 210 of the transistors 200, 201. Specifically, a first terminal of the driver circuit 220 may be coupled to the gates 210 of the transistors 200, 201 and a second terminal of the driver circuit 220 may be coupled to the sources 211 of the transistors 200, 201.

Figure 3:
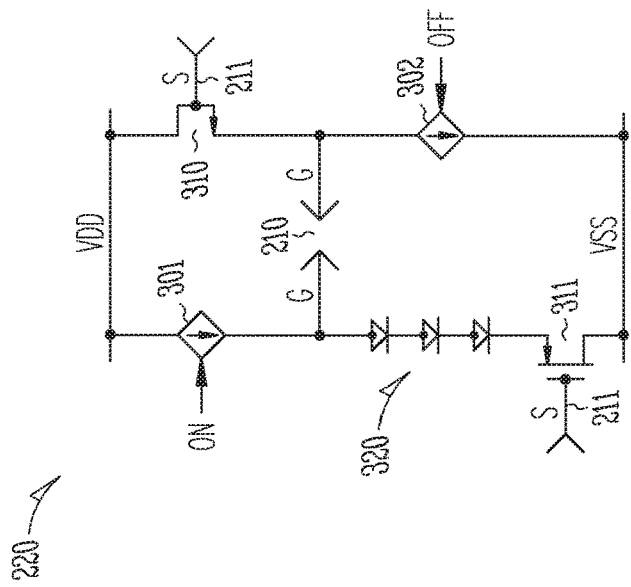
FIG. 3 is a schematic diagram of a driver circuit, such as in accordance with the NLDFET input switch circuit embodiment of FIG. 2.

The driver circuit 220, illustrated in greater detail in FIG. 3, is a floating voltage source that may be configured to provide one or more predetermined (approximately) constant gate-to-source voltages $V_{gs}$ to the transistors 200, 201. A predetermined constant gate-to-source voltage $V_{gs}$ may be provided in response to "ON" or "OFF" signals (see FIG. 3).

To turn the switch circuit on (e.g., activate the switch), the predetermined constant gate-to-source voltage $V_{gs}$ supplied by the driver circuit 220 may be large enough to turn the transistors 200, 201 on. Specifically, the gate-to-source voltage $V_{gs}$ applied can allow current to flow from the drain to the source and from the source to the drain of the transistors 200, 201, respectively. To turn the switch circuit off (e.g., deactivate the switch), the predetermined constant gate-to-source voltages $V_{gs}$ supplied by the driver circuit 220 may be below the required value to turn on the transistors 200, 201. This gate-to-source voltage $V_{gs}$ can be any value below the threshold voltage of the transistors 200, 201, including but not limited to, zero volts or a negative voltage.

Thus, a first predetermined constant voltage $V_{gs1}$ may be supplied by the driver circuit 220 to turn on the switch and a second predetermined constant voltage $V_{gs2}$ may be supplied by the driver circuit 220 to turn off the switch. $V_{gs1}$ may be a positive voltage and $V_{gs2}$ may be zero or a negative voltage. When the switch is on or activated, $V_{in}$ applied to the drain of the first transistor 200 may be provided to the drain of the second transistor 201 as $V_{out}$. When the switch is off, no signal will be allowed to flow between the drains of the transistors 200, 201 (e.g., between $V_{IN}$ and $V_{OUT}$ terminals).

The driver circuit 220 may be configured to provide a first predetermined constant voltage $V_{gs1}$ which approximately equals or exceeds the voltage needed to turn the transistors 200, 201 on. The first predetermined constant voltage $V_{gs1}$ can include two components. A first component may be a threshold voltage that is needed to turn on the switch. A second component may be an overdrive voltage used to control various parameters of the switch. The overdrive voltage may be used to control switch parameters such as the on-resistance of the transistors. The two components may be summed by the driver circuit 220.

The driver circuit 220 may be configured to provide a second predetermined constant voltage $V_{gs2}$ that is less than the voltage needed to turn the transistors 200, 201 on. The driver circuit 220 may be configured to change the magnitude and sign of the predetermined constant voltage $V_{gs}$. Thus, the driver circuit 220 may be configured to provide a second predetermined constant voltage $V_{gs2}$ that is zero or a negative value. Providing a second predetermined constant voltage $V_{gs2}$ that is negative can provide advantages such as reducing switch leakage.

As discussed herein, a predetermined constant gate-to-source voltage $V_{gs}$ provided by the driver circuit 220 may be approximately constant to within a degree that accounts for normal circuit operation variation due to temperature changes or noise. That is, the predetermined constant gate-to-source voltages $V_{gs}$ may be constant in that they are DC voltage values, rather than AC voltage values. Further, the predetermined constant gate-to-source voltages $V_{gs}$ may be considered as not having a time-varying component other than changing from the first value $V_{gs1}$ to the second value $V_{gs2}$ in response to a change in logic state of the "ON" or "OFF" signals, for example.

FIG. 3 is a schematic diagram of a driver circuit 220, in accordance with the NLDFET input switch circuit embodiment of FIG. 2. The driver circuit 220 of FIG. 3 is for purposes of illustration only as other driver circuits may be used to produce the proper voltages for operation of the NLDFET input switch circuit of FIG. 2.

The driver circuit 220 includes a first current source 301, a second current source 302, a first transistor 310, a second transistor 311, and a plurality of diodes 320. The first transistor 310 may be an NFET while the second transistor 311 may be a PFET.

The first current source 301, controlled by the "ON" signal, is coupled between a positive supply voltage $V_{DD}$ and the anode side of the plurality of diodes 320 that are coupled in series. The gate connection 210 is coupled to the node between the current source 301 and the plurality of diodes 320. A source node of the second transistor 311 is coupled to the cathode side of the plurality of diodes 320. A drain node of the second transistor 311 is coupled to a negative supply voltage $V_{SS}$. A gate node of the second transistor 311 is coupled to the common source connection 211 of the switch of FIG. 2.

The second current source 302, controlled by the "OFF" signal, is coupled between the negative supply voltage $V_{SS}$ and the source node of the first transistor 310. The common node between the second current source 302 and the first transistor 310 is coupled to the common gate connection 210 of the switch of FIG. 2. The drain node of the first transistor 310 is coupled to the positive supply voltage $V_{DD}$. The gate node of the first transistor 310 is coupled to the common source connection 211 of the switch of FIG. 2.

In operation, a true "ON" signal (e.g., 5V) turns on the first current source 301 to force current through the diodes 320 and the second transistor 311. At this time, the second current source 302 is turned off by false "OFF" signal (e.g., 0V). This results in a voltage at the common gate connection 210 of the voltage drop across the three diodes 320 plus the gate-to-source voltage $V_{GS}$ of the second transistor 311. This voltage turns on the switch of FIG. 2. In an embodiment, this circuit may create a floating voltage source of +5V. Other embodiments may use different voltages.

When it is desired to turn the switch of FIG. 2 off, a true "OFF" signal (e.g., 5V) turns on the second current source 302 while the first current course 301 is turned off by a false "ON" signal (e.g., 0V). The resulting current through the first transistor 310 forces the common gate connection 210 to a gate-to-source voltage $V_{GS}$ drop (e.g., one diode voltage drop) below the source potential, thus creating a negative voltage between the common gate connection 210 and the common source connection 211 of the switch of FIG. 2. In an embodiment, this circuit may create a floating voltage source of −1V. Other embodiments may use different voltages.

Figure 4:
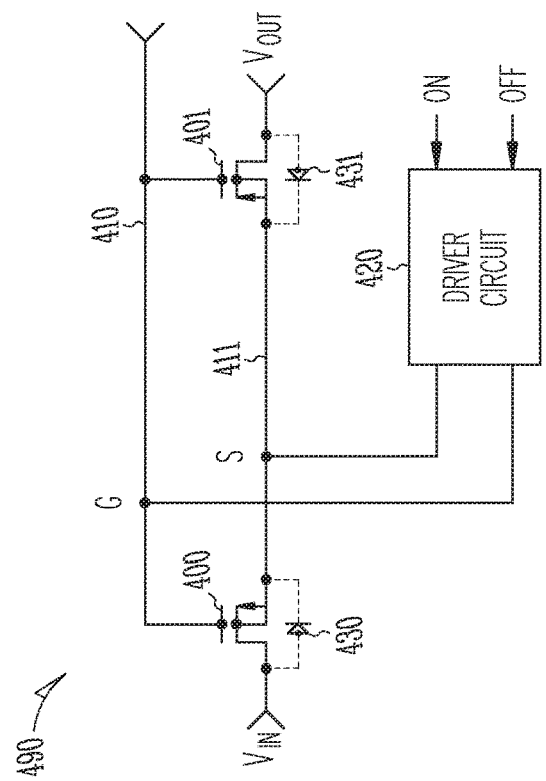
FIG. 4 is a schematic diagram of a p-laterally diffused field-effect transistor (PLDFET) input switch circuit, such as in accordance with various embodiments.

FIG. 4 is a schematic diagram of a PLDFET input switch circuit, in accordance with various embodiments. In an embodiment, these switches are PLDMOS switches.

As shown in FIG. 4, the switch circuit may include a first transistor 400, a second transistor 401, and a driver circuit 420. The transistors 400, 401 may be PLDFETs (e.g., PLDMOS transistors). The transistors 400, 401 can have their back gates connected to their sources, but are not so limited. The transistors 400, 401 are illustrated with diodes 430, 431 shown in phantom to depict the biasing that allows current to flow from the source/back gate terminal to the drain terminal of each of the transistors 400, 401. Specifically, when the sources of the transistors 400, 401 are at a higher potential than their respective drains, the body diode 430, 431 (PN junction formed by the back gate and the drain) is forward biased, allowing current to flow from the source/back gate terminals to the drain terminals.

As shown in FIG. 4, the drain of the transistor 400 may be configured to be an input terminal (e.g., $V_{IN}$) and the drain of the transistor 401 may be configured to be an output terminal (e.g., $V_{OUT}$). The gates 410 of the transistors 400, 401 may be coupled to each other. Similarly, the sources 411 of the transistors 400, 401 can be coupled to each other. The driver circuit 420 may be coupled between the connected sources 411 and the connected gates 410 of the transistors 400, 401. Specifically, a first terminal of the driver circuit 420 may be coupled to the gates 410 of the transistors 400, 401 and a second terminal of the driver circuit 420 may be coupled to the sources 411 of the transistors 400, 401.

Figure 5:
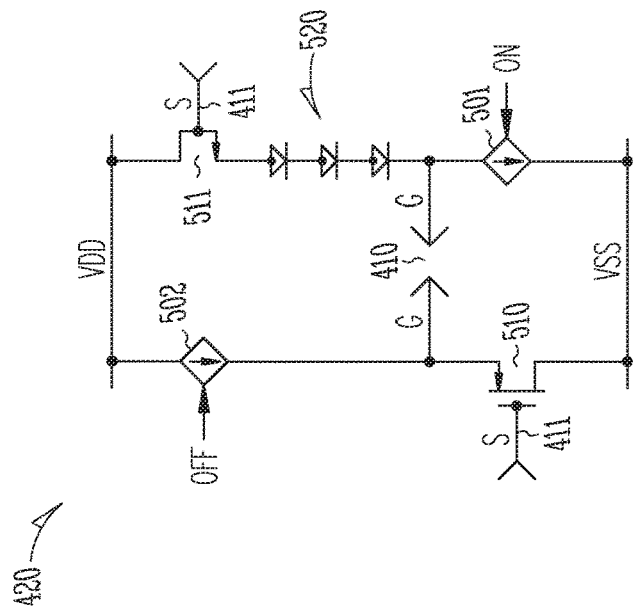
FIG. 5 is a schematic diagram of a driver circuit, such as in accordance with the PLDFET input switch circuit embodiment of FIG. 4.

The driver circuit 420, illustrated in greater detail in FIG. 5, is a floating voltage source that may be configured to provide one or more predetermined (approximately) constant gate-to-source voltages $V_{gs}$ to the transistors 400, 401. A predetermined constant gate-to-source voltage $V_{gs}$ may be provided in response to "ON" or "OFF" signals (see FIG. 5).

To turn the switch circuit on, the predetermined constant gate-to-source voltage $V_{gs}$ supplied by the driver circuit 420 may be large enough to turn the transistors 400, 401 on. Specifically, the gate-to-source voltage $V_{gs}$ applied can allow current to flow from the drain to the source and from the source to the drain of the transistors 400, 401, respectively. To turn the switch circuit off the predetermined constant gate-to-source voltages $V_{gs}$ supplied by the driver circuit 420 may be below the required value to turn on the transistors 400, 401. This gate-to-source voltage $V_{gs}$ can be any value below the threshold voltage of the transistors 400, 401, including but not limited to, zero volts or a negative voltage.

Thus, a first predetermined constant voltage $V_{gs1}$ may be supplied by the driver circuit 420 to turn on the switch and a second predetermined constant voltage $V_{gs2}$ may be supplied by the driver circuit 420 to turn off the switch. $V_{gs1}$ may be zero or a negative voltage and $V_{gs2}$ may be a positive voltage. When the switch is on or activated, $V_{in}$ applied to the drain of the transistor 400 may be provided to the drain of the transistor 401 as $V_{out}$. When the switch is off, no signal will be allowed to flow between the drains of the transistors 400, 401 (e.g., between $V_{IN}$ and $V_{OUT}$ terminals).

The driver circuit 420 may be configured to provide the first predetermined constant voltage $V_{gs1}$ that is a negative voltage. The first predetermined constant voltage $V_{gs1}$ can include two components. A first component may be a threshold voltage that is needed to turn on the switch. A second component may be an overdrive voltage used to control various parameters of the switch. The overdrive voltage may be used to control switch parameters such as the on-resistance of the transistors. The two components may be summed by the driver circuit 420.

The driver circuit 420 may be configured to provide the second predetermined constant voltage $V_{gs2}$ that is a positive voltage. The driver circuit 420 may be configured to change the magnitude and sign of the predetermined constant voltage $V_{gs}$. Generating a second predetermined constant voltage $V_{gs2}$ that is positive provides advantages such as reduced switch leakage.

As discussed herein, a predetermined constant gate-to-source voltage $V_{gs}$ provided by the driver circuit 420 may be approximately constant to within a degree that accounts for normal circuit operation variation due to temperature changes or noise. That is, the predetermined constant gate-to-source voltages $V_{gs}$ may be constant in that they are DC voltage values, rather than AC voltage values. Further, the predetermined constant gate-to-source voltages $V_{gs}$ may be considered as not having a time-varying component other than changing from the first value $V_{gs1}$ to the second value $V_{gs2}$ in response to a change in logic state of the "ON" or "OFF" signals, for example.

FIG. 5 is a schematic diagram of a driver circuit 420, in accordance with the PLDFET input switch circuit embodiment of FIG. 4. The driver circuit 420 of FIG. 5 is for purposes of illustration only as other driver circuits may be used to produce the proper voltages for operation of the PLDFET input switch circuit of FIG. 4. This circuit is complementary to the driver circuit of FIG. 3.

The driver circuit 420 includes a first current source 501, a second current source 502, a first transistor 510, a second transistor 511, and a plurality of diodes 520. The first transistor 510 may be a PFET while the second transistor 511 may be an NFET.

The first current source 501, controlled by the "ON" signal, is coupled between a negative supply voltage $V_{SS}$ and the cathode side of the plurality of diodes 520 that are coupled in series. The gate connection 410 is coupled to the node between the current source 501 and the plurality of diodes 520. A source node of the second transistor 511 is coupled to the anode side of the plurality of diodes 520. A drain node of the second transistor 511 is coupled to a positive supply voltage $V_{DD}$. A gate node of the second transistor 511 is coupled to the common source connection 411 of the switch of FIG. 4.

The second current source 502, controlled by the "OFF" signal, is coupled between the positive supply voltage $V_{DD}$ and the source node of the first transistor 510. The common node between the second current source 502 and the first transistor 510 is coupled to the common gate connection 410 of the switch of FIG. 4. The drain node of the first transistor 510 is coupled to the negative supply voltage $V_{SS}$. The gate node of the first transistor 510 is coupled to the common source connection 411 of the switch of FIG. 4.

In operation, a true "ON" signal (e.g., 5V) turns on the first current source 501 to force current through the diodes 520 and the second transistor 511. At this time, the second current source 502 is turned off by false "OFF" signal (e.g., 0V). This results in a voltage at the common gate connection 410 of the voltage drop across the three diodes 520 plus the gate-to-source voltage $V_{GS}$ of the second transistor 511. This voltage turns on the switch of FIG. 4. In an embodiment, this circuit may create a floating voltage source of −5V. Other embodiments may use different voltages.

When it is desired to turn the switch of FIG. 2 off, a true "OFF" signal (e.g., 5V) turns on the second current source 502 while the first current course 501 is turned off by a false "ON" signal (e.g., 0V). The resulting current through the first transistor 510 forces the common gate connection 410 to a gate-to-source voltage $V_{GS}$ drop (e.g., one diode voltage drop) below the source potential, thus creating a positive voltage between the common gate connection 410 and the common source connection 411 of the switch of FIG. 4. In an embodiment, this circuit may create a floating voltage source of 1V. Other embodiments may use different voltages.

The NLDMOS and PLDMOS input switch circuits of FIGS. 2 and 4, respectively, can be used for sampling the voltages that do not need the level shifting feature in order to sample a voltage greater than the supply voltage. For example, the NLDMOS and PLDMOS input switch circuits may be used as input switch circuits 121-127 for sampling voltage $V_{IN0}$-$V_{IN11}$ of FIG. 1.

Figure 6:
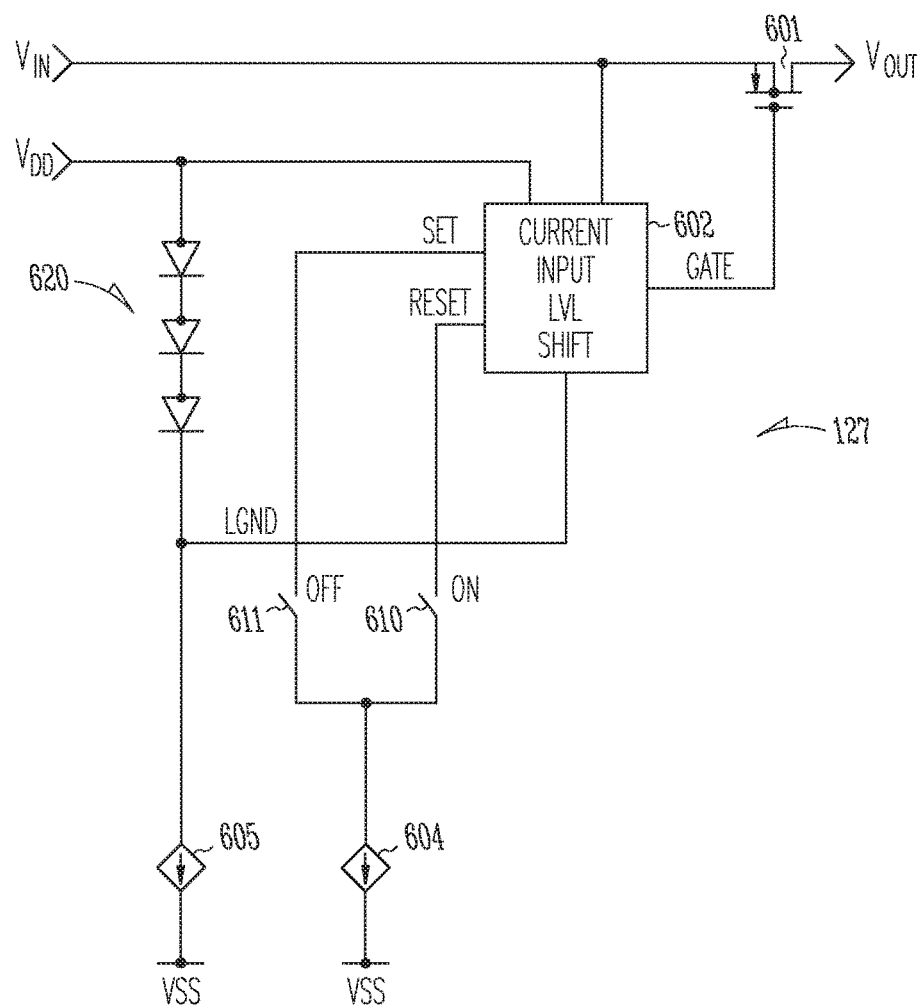
FIG. 6 is a schematic diagram of a level shifting input switch circuit, such as in accordance with various embodiments.
Figure 7:
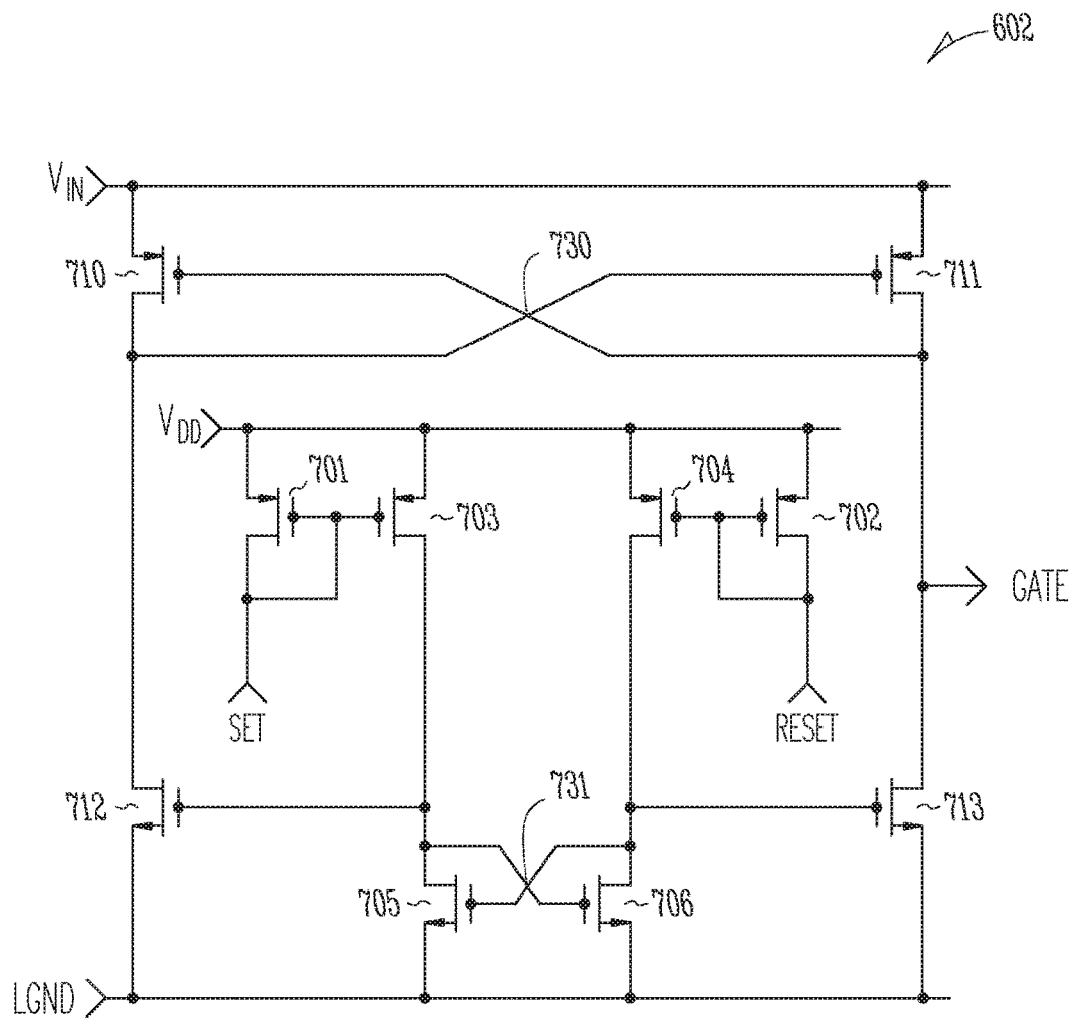
FIG. 7 is a schematic diagram of a level shifting driver circuit, such as in accordance with the level shifting input switch circuit of FIG. 6.

FIG. 6 is a schematic diagram of a level shifting input switch circuit, in accordance with various embodiments. The level shifting input switch circuit includes a transistor 601, a current input level shift circuit 602, an ON switch 610, an OFF switch 611, a first current source 604, a second current source 605, and a plurality of diodes 620. An implementation of the current input level shift circuit 602 is illustrated in FIG. 7 and discussed subsequently.

The transistor 601 is coupled between the $V_{IN}$ node (e.g., $V_{IN12}$ from FIG. 1) and the $V_{OUT}$ node from the switch. The transistor 601 may be a PLDFET (e.g., PLDMOS transistor). The source of the transistor 601 is coupled to the $V_{IN}$ terminal and the drain of the transistor 601 is coupled to the $V_{OUT}$. The gate of the transistor 601 is coupled to the current input level shift circuit 602.

The plurality of diodes 620 are coupled between the positive supply voltage $V_{DD}$ and the second current source 605. The plurality of diodes 620 provides a predetermined voltage drop that may be achieved by other circuit elements. The current source 605 is also coupled to the negative supply voltage $V_{SS}$. The current input level shift circuit 602 elevated ground (LGND) is coupled to the node between the cathode of the plurality of diodes 620 and the second current source 605.

The plurality of diodes 620 (e.g., voltage drop element) are shown for purposes of producing a particular voltage drop. Other circuit components may be substituted to obtain a substantially similar voltage drop.

The ON switch 610 is coupled between a RESET terminal of the current input level shift circuit 602 and the first current source 604. The OFF switch 611 is coupled between a SET terminal of the current input level shift circuit 602 and the first current source 604. The first current source 604 is coupled between a common node of the ON and OFF switches and the negative supply voltage $V_{SS}$.

In operation, activating the ON switch 610 draws current from the RESET terminal of the current input level shift circuit 602. As will be seen from the embodiment of FIG. 7, the gate node of the transistor 601 will be tied to the voltage at LGND. The LEND voltage is equal to $V_{DD}$ minus the three diode voltage drops. The LGND voltage causes the transistor to turn on (e.g., level shifting switch circuit turns on) and allow the voltage at the $V_{IN}$ node (e.g., $V_{IN12}$) to pass through to the $V_{OUT}$ node.

Similarly, activating the OFF switch 611 draws current from the SET terminal of the current input level shift circuit 602. As will be seen from the embodiment of FIG. 7, the gate node will be pulled high, turning off the transistor 601 such that $V_{IN}$ is isolated from $V_{OUT}$.

FIG. 7 is a schematic diagram of a level shifting driver circuit 602, in accordance with the level shifting input switch circuit of FIG. 6. The level shifting driver circuit 602 enables the $V_{IN}$ voltage (e.g., $V_{IN12}$) to be a diode voltage drop greater than the positive supply voltage ($V_{DD}$). The schematic of the level shifting driver circuit 602 is for purposes of illustration only as other level shifting circuits may be used to achieve substantially similar results.

The level shifting driver circuit 602 includes a first transistor 701, a second transistor 702, a third transistor 703, a fourth transistor 704, a fifth transistor 705, a sixth transistor 706, a seventh transistor 710, an eighth transistor 711, a ninth transistor 712, and a tenth transistor 713. In an embodiment, the first, second, third, fourth, seventh, and eighth transistors 701-704, 710, 711 are PFETs while the fifth, sixth, ninth, and tenth transistors 705, 706, 712, 713 are NFETs. Other embodiments may use other types of transistors.

The sources of the first through fourth transistors 701-704 are coupled to the positive supply voltage $V_{DD}$. The gates of the first and second transistors 701, 702 are coupled to their respective drains as well as respectively coupled to the SET and RESET terminals.

The gates of the third and fourth transistors 703, 704 are respectively coupled to the drains of the first and second transistors 701, 702. The drains of the third and fourth transistors 703, 704 are respectively coupled to the drains of the fifth and sixth transistors 705, 706 as well as the gates of the ninth and tenth transistors 712, 713. The drain of the fifth transistor 705 is also coupled to the gate of the sixth transistor 706 and the drain of the sixth transistor 706 is coupled to the gate of the fifth transistor 705. The sources of the fifth and sixth transistors 705, 706 as well as the sources of the ninth and tenth transistors 712, 713 are coupled to the elevated ground terminal (LGND). The drains of the ninth and tenth transistors 712, 713 are respectively coupled to the drains of the seventh and eight transistors 710, 711.

The sources of the seventh and eighth transistors 710, 711 are coupled to the $V_{IN}$ terminal. The gate of the seventh transistor 710 is coupled to the drain of the eighth transistor 711 while the gate of the eighth transistor 711 is coupled to the drain of the seventh transistor 710.

In operation, a current on the SET terminal causes the first transistor 701 to turn on, turning on the third transistor 703 and pulling the gate of the sixth transistor 706 to $V_{DD}$ to turn on the sixth transistor 706. Turning on the sixth transistor 706 pulls the gate of the tenth transistor 713 to LGND (which is biased at a voltage that is the sum of three diode voltage drops) turning off the tenth transistor 713. Since the gate of the ninth transistor 712 is at $V_{DD}$, it is turned on and its drain is pulled to LGND which pulls the gate of the eighth transistor 711 to LGND to turn on the eighth transistor 711. Turning on the eighth transistor 711 pulls the GATE terminal to the $V_{IN}$ voltage (turning off the PFET 601 of FIG. 6).

A current on the RESET terminal causes the second transistor 702 to turn on, turning on the fourth transistor 704 and pulling the gate of the tenth transistor 713 to $V_{DD}$ such that the GATE terminal is pulled to LGND (which is biased at a voltage that is the sum of three diode voltage drops). Referring again to FIG. 6, when the GATE terminal is at LGND, the gate of the PFET 601 is at LGND, turning on the transistor 601 and allowing the $V_{IN}$ to transfer to $V_{OUT}$.

The cross-over lines 730, 731 represent the positive feedback of the level shifting circuit 602. A pulse of current on either the RESET terminal or the SET terminal sets their corresponding transistor circuits to their respective states (off or on) and keep those states.

Figure 8:
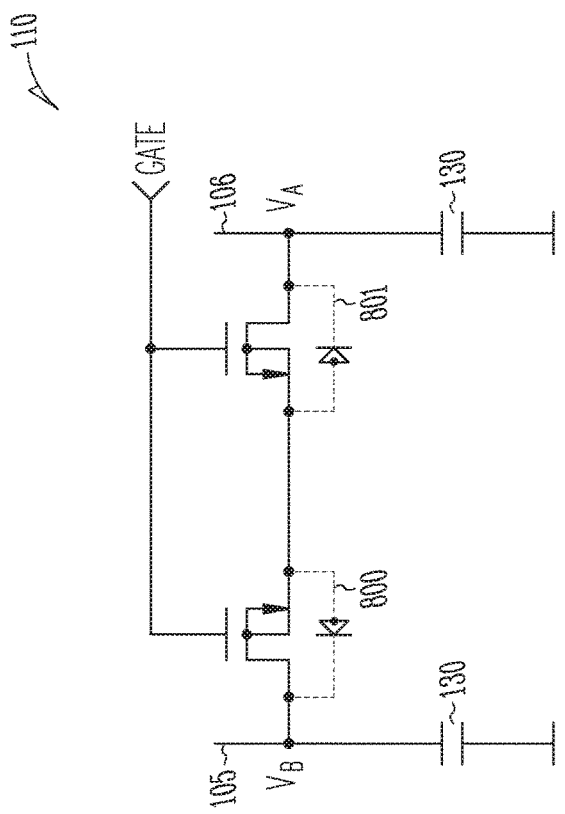
FIG. 8 is a schematic diagram of a shorting switch circuit, such as in accordance with various embodiments.

FIG. 8 is a schematic diagram of a shorting switch circuit 110, such as in accordance with various embodiments. As illustrated in FIG. 1, the shorting switch circuit 110 provides shorting between the first and second differential output terminals 105, 106. This switch provides the shorting function even when it is not known which of the differential output terminals 105, 106 is at a higher potential.

Referring again to FIG. 1, it can be seen that, as the differential voltage of each respective battery 150-155 in the stack of batteries is sampled from top to bottom of the battery stack, the higher potential flips back and forth between the first and second differential outputs 105, 106. For example, if it is desired to measure the voltage across the top battery 155, the top switch 127 is turned on so that $V_{IN12}$ is connected to the second differential output 106 and the next switch 126 down is turned on so that $V_{IN11}$ is connected to the first differential output 105. In this case, the second differential output 106 is coupled to the higher potential. When it is desired to measure the voltage across the next battery 154 from the top, the top switch 127 is opened, the next switch 126 down is closed, thus coupling the higher potential of the battery 154 ($V_{IN11}$) to the first differential output 105. The third switch 125 from the top is closed to couple the lower potential of the battery 154 ($V_{IN10}$) to the second differential output 106. Thus, measuring battery voltages downward in the stack of batteries 150-155, the higher potential has flipped from the second differential output 106 to the first differential output 105. The shorting switch circuit 110 is able to short the first and second differential outputs 105, 106 together even when the output with the higher potential changes.

The shorting switch circuit 110 includes a first transistor 800 and a second transistor 801. In an embodiment, the transistors are NFETs (e.g., NLDMOS). The input capacitors 130 for the ADC 101 of FIG. 1 are shown for purposes of illustration but are not part of the shorting switch circuit 110.

The drain of the first transistor 800 is coupled to the first differential output terminal 105. The sources of the first and second transistors 800, 801 are coupled together. The drain of the second transistor 801 is coupled to the second differential output terminal 106. The gates of both transistors 800, 801 are coupled together and coupled to a gate driver circuit (see FIG. 9).

The shorting switch circuit 110 remains off when either of the first or second differential output terminal voltages is greater than the positive supply voltage VDD. The shorting switch circuit 110 turns on for a relatively wide range of common mode voltages at the first or second differential output terminals 105, 106. The switch 110 also does not use any current from either output terminal 105, 106 while turning on or off. The voltages at the output terminals 105, 106 remains relatively steady when the switch is on due to the capacitive level shifter based gate driver for the shorting switch circuit 110.

In operation, both transistors 800, 801 turn on, causing the switch 110 to turn on and short the first differential output terminal 105 to the second differential output terminal 106, when their respective gate voltages (GATE) are at some positive voltage. Both transistors 800, 801 turn off when their respective gate-to-source voltages are 0V or some negative voltage. When the switch 110 is turned off, the first differential output terminal 105 is isolated from the second differential output terminal 106. The gate voltage (GATE) is driven by a gate driver circuit such as illustrated in FIG. 9.

Figure 9:
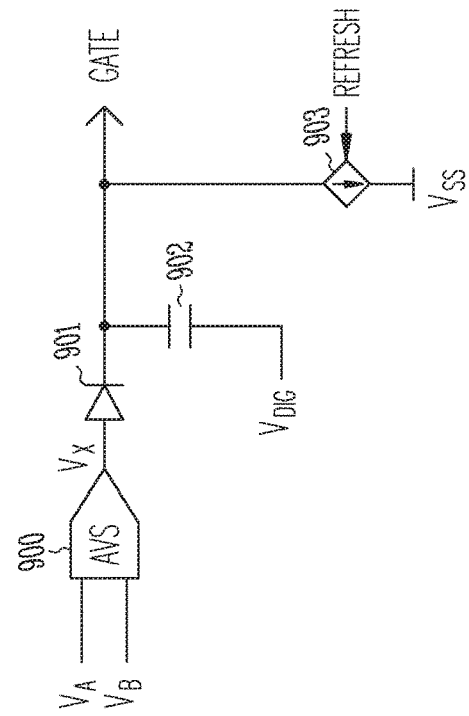
FIG. 9 is a schematic diagram of a gate circuit, such as in accordance with the shorting switch circuit of FIG. 8.

FIG. 9 is a schematic diagram of a gate driver circuit, such as in accordance with the shorting switch circuit of FIG. 8.

The elements of FIG. 9 are shown for purposes of illustration. Other circuit elements may be used to achieve substantially similar results.

The capacitively coupled gate driver circuit includes an adaptive voltage selector circuit 900, a diode 901, a capacitance (e.g., capacitor) 902, and a current source 903. The comparator circuit 900 is coupled to the first and second differential output terminals represented by voltage nodes $V_A$ and $V_B$ as shown. The output of the adaptive voltage selector circuit 900 is coupled to the anode of the diode 901. The cathode of the diode 901 is coupled to a node comprising the GATE output (to the gates of the shorting switch transistors 800, 801), the capacitor 902, and the current source 903. The other side of the capacitor 902 is coupled to a digital control voltage $V_{DIG}$ (e.g., 0-5V). The other side of the current source 903 is coupled to the negative supply voltage $V_{SS}$.

The diode 901 as shown is for purposes of generating a particular voltage drop at the GATE output. Any other circuit element (e.g., voltage drop element) may be substituted for the diode, in this embodiment as well as others, that produces a substantially similar voltage drop.

A circuit embodiment of the adaptive voltage selector circuit 900 is illustrated in FIG. 10. The adaptive voltage selector circuit 900 provides the function of outputting $V_X$ that is the minimum of $V_A$ or $V_B$. Thus, if $V_A<V_B$, $V_X=V_A$; if $V_B<V_A$, $V_X=V_B$. Other comparator circuits that provide substantially the same function may be implemented as the adaptive voltage selector circuit 900.

Operation of the driver circuit may be illustrated with reference to the timing diagram of FIG. 11. FIG. 11 is a timing diagram of switch operation, such as in accordance with the shorting switch circuit of FIG. 8. Any voltages or logic levels shown in the timing diagram are for purposes of illustration only as other voltages may be used.

In operation, the REFRESH signal is high while the circuit is off. At this time the ON control signal and the $V_{DIG}$ signals are both low. In this example operation, it is assumed that $V_B$ is less than $V_A$. The current source 903 causes the GATE node to charge to a diode voltage drop below a buffered version of $V_B$. This voltage is denoted as $V_X$ in FIG. 9. The GATE voltage is now $V_B-V_{DIODE}$ that turns off the switch 110 of FIG. 8 since $V_{GS}$ is less than 0V.

When it is desired to turn the switch on, the ON control signal is brought high, the $V_{DIG}$ signal is brought high, and the REFRESH signal is brought low, turning off the current source 903. The $V_{DIG}$ signal charges the capacitor 902 to $V_{DIG}$ so that GATE is now $V_B-V_{DIODE}+5V$. The $V_{GS}$ of the switch 110 is now $5V-V_{DIODE}$ which turns the switch 110 on.

FIG. 10 is a schematic diagram of the adaptive voltage selector circuit 900, such as in accordance with the driver circuit of FIG. 9. The circuit 900 includes a first transistor 1000, a second transistor 1002, a third transistor 1003, a first current source 1001, and a second current source 1004. In an embodiment, the first transistor 1000 is an NFET (e.g., NLDMOS) and the second and third transistors 1002, 1003 are PFETs (e.g., PLDMOS).

The node between the source of the first transistor 1000 and the first current source 1001 is the output of the circuit $V_X$. The gate of the first transistor 1000 is coupled to the node between the second current source 1004 and the coupled source terminals of the pair of second and third transistors 1002, 1003. The drain of the first transistor 1000 is coupled to the other side of the second current source 1004.

The drains of the second and third transistors 1002, 1003 are coupled together at a node and that node is coupled to the other side of the first current source 1001. The gate of the second transistor is coupled to the $V_B$ node of the circuits of FIGS. 8 and 9. The gate of the third transistor is coupled to the $V_A$ node of the circuits of FIGS. 8 and 9.

In operation, when $V_B < V_A$ ($V_A < V_B$) the second transistor 1002 (third transistor 1003) takes all the current from current source 1004 setting the source node voltage to a threshold voltage above $V_B$ (or $V_A$). The transistor 1004 and current source 1001 acts as an analog voltage follower, and generates a voltage $V_X = V_B(V_A) + V_{TH,p} - V_{TH,n}$ (where $V_{TH,p}$ and $V_{TH,n}$ are the threshold voltages of PLDMOS and NLDMOS respectively).

Figure 12:
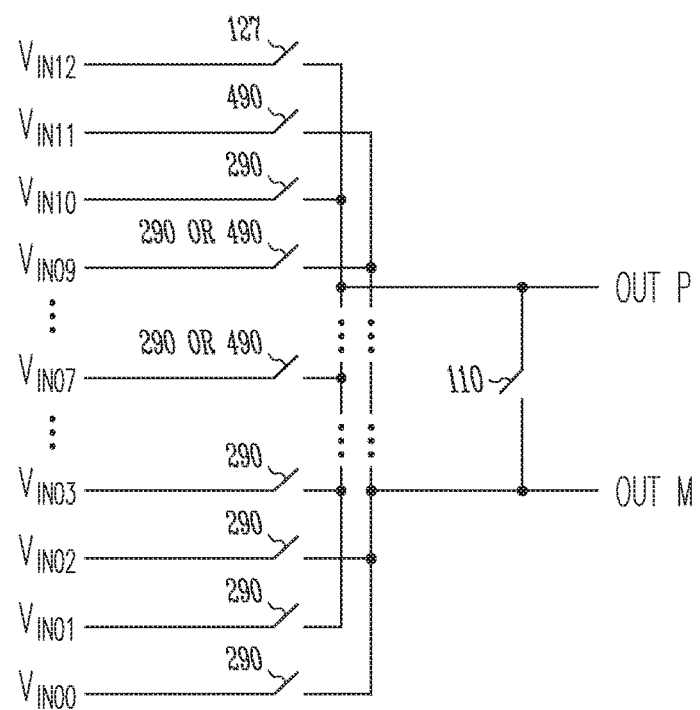
FIG. 12 is a diagram of switch layout of the analog multiplexer, such as in accordance with various embodiments.

FIG. 12 is a diagram of switch layout of the analog multiplexer, such as in accordance with various embodiments. As in the embodiment of FIG. 1, the use of twelve voltage inputs $V_{IN0} - V_{IN12}$ is for purposes of illustration only as other embodiments may have different numbers of input.

The even switches (e.g., $V_{IN0}$, $V_{IN02}$, $V_{IN10}$, $V_{IN12}$) are coupled to the differential output terminal OUTP. The odd switches (e.g., $V_{IN01}$, $V_{IN03}$, $V_{IN09}$, $V_{IN11}$) are coupled to the differential output terminal OUTM. The shorting switch circuit 110 is coupled between the OUTP and the OUTM terminals.

The level shifting switch circuit 127 is located at the top of the switch layout. This location is based on the assumption that the analog multiplexer is used to measure the voltages of a stack of batteries. In such an embodiment, $V_{IN12}$ would be the highest voltage and, thus, would benefit from the ability of the level shifting switch circuit 127 to be able to sample a voltage that is greater than the supply voltage.

Once the level shifting switch circuit 127 turns on, all of the even switches coupled to the differential output terminal OUTP will see a voltage that is greater than $V_{DD}$ on its respective node. In such an embodiment, the P-type switches 490 (see FIG. 4) should not be coupled to the OUTP terminal. Thus, the N-type switches 290 (see FIG. 2) are coupled to the same output terminal as the level shifting switch circuit 127.

The $V_{IN11}$ switch is a P-type switch 490 since the voltage near $V_{DD}$ may not be sufficient for an N-type switch 290. The odd switches for the $V_{IN09}$, $V_{IN07}$, $V_{IN03}$ inputs may be either N-type switches 290 or P-type switches 490. The lower odd or even switches may be N-type switches 290.

A refresh biasing scheme may be added to the above-described switches in order to decrease the length of their respective turn-on times (e.g., turn on faster). The gates of the NLDFETs and the PLDFETs are floating. However, even with the bulk-to-drain diodes inherent in the NLDFET and PLDFET, the internal node of the PLDFET can float up but not down and the internal node of the NLDFET can float down but not up. A typical input switch will experience MUX output transients during a sample-and-convert cycle of the example analog MUX and ADC circuit of FIG. 1. These transients may be capacitively coupled to the internal floating bulk node of the input switch circuits such that this node voltage goes low with the MUX output. Thus, when the switch is turned on, the internal node starts from a voltage much lower than the input voltage (e.g., $V_{IN0} - V_{IN12}$) causing additional time in order for the sampling of an input voltage.

FIG. 13 are schematic diagrams of the NLDFET and PLDFET input switch circuits with refresh biasing circuitry, such as in accordance with various embodiments. The refresh biasing circuitry for the NLDFET switch 290 includes a current source 1300. The refresh circuitry for the PLDFET switch 490 includes a current source 1301. In each case the current source may be capable of charging the intermediate node of these FET switches to a voltage near $V_{IN}$ within a duration of approximately 10 ns at the start of each sampling cycle of the switch.

In operation, when either the NLDFET or PLDFET is turned on for sampling an input voltage ($V_{IN}$), the REFRESH signal turns on the current source 1300, 1301 to generate a current pulse of approximately 10 ns. The extra pulse of current for the relatively short duration through the respective switch's body diode aids in the switch being able to increase the source node of the switch to the sampled voltage.

The previously described embodiments of the various switch embodiments may refer to a particular N-type or P-type laterally diffused field effect transistor (LDFET) or a particular N-type or P-type switch being used. This is for purposes of illustration only since equivalent functions may be achieved by substituting an opposite conductivity transistor or switch by inverting the polarity of the described positive and negative supply voltages.

Figure 14:
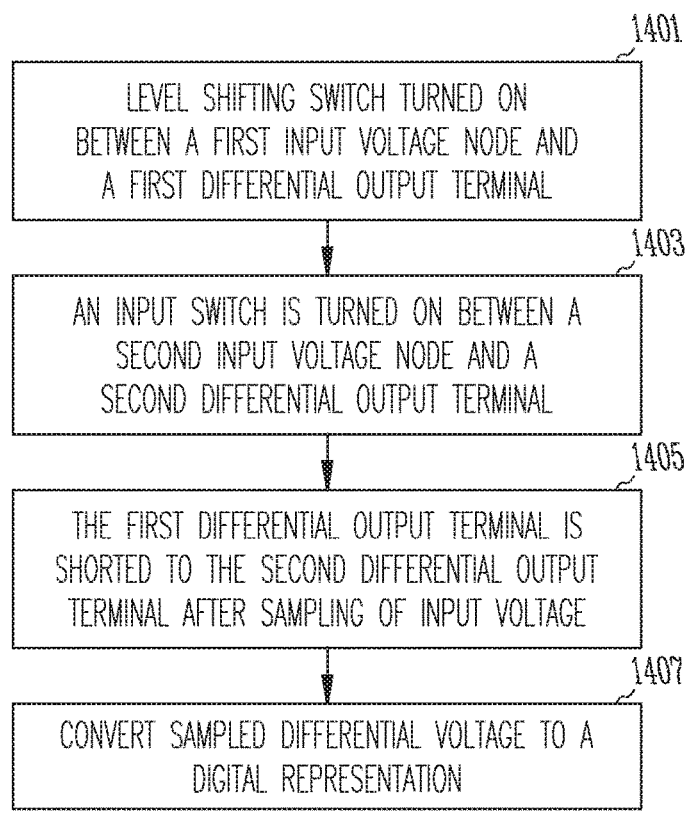
FIG. 14 is a flowchart of a method for analog multiplexer operation, such as in accordance with various embodiments.

FIG. 14 is a flowchart of a method for analog multiplexer operation, such as in accordance with various embodiments. In block 1401, a level shifting switch circuit is activated (e.g., turned on) between a first input voltage node and a first differential output terminal wherein the first input voltage node comprises the input voltage having a higher voltage level than the upper supply voltage. In block 1403, an input switch is activated between a second input voltage node and a second differential output terminal. In block 1405, the first differential output terminal is shorted to the second differential output terminal after sampling of the input voltage.

In block 1407, the method may optionally include converting a differential voltage at the first and second differential output terminals to a digital representation. The method may further include sequentially activating different pairs of input switch circuits of the plurality of input switch circuits such that a voltage on the first differential output terminal is higher than a voltage on the second differential output terminal at a first time and the voltage on the second differential output terminal is higher than the voltage on the first differential output terminal at a second time responsive to activation of different combinations of pairs of input switch circuits.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An analog multiplexer for sampling an input voltage capable of having a higher voltage level than an upper supply voltage of the multiplexer, the multiplexer comprising:
   a plurality of input switch circuits, each input switch circuit coupled between a respective input and one of a first or a second differential output, at least one of the plurality of input switch circuits comprising a level shifting switch circuit configured to sample the input voltage capable of having the higher voltage level than the upper supply voltage; and
   a shorting switch circuit coupled between the first and second differential outputs; the shorting switch circuit comprising a capacitively coupled gate drive circuit and configured to short the first differential output to the second differential output after the input voltage is sampled.

2. The analog multiplexer of claim 1, wherein the level shifting switch circuit comprises:
   a laterally diffused field effect transistor (LDFET) coupled between the respective switch input and the first differential output; and
   a gate driver circuit coupled to a gate of the LDFET and configured to generate a gate control signal; the gate driver circuit comprising a plurality of level shifter circuits coupled together in a cascade configuration and coupled to the upper supply voltage and the respective switch input.

3. The analog multiplexer of claim 2, wherein one or more of the plurality of input switch circuits comprises:
   a first LDFET and a second LDFET, the first LDFET having a source node coupled to a source node of the second LDFET, the first LDFET and the second LDFET each having a gate coupled to another gate driver circuit.

4. The analog multiplexer of claim 1, wherein one or more of the plurality of input switch circuits comprises:
   a first LDFET and a second LDFET, the first LDFET having a source node coupled to a source node of the second LDFET, the first LDFET and the second LDFET each having a gate coupled to a gate driver circuit.

5. The analog multiplexer of claim 4, wherein the one or more of the plurality of input switch circuits further comprises a refresh current source coupled to the source nodes of the first and second LDFETs and configured to generate a current pulse into the source nodes during a voltage sampling operation.

6. The analog multiplexer of claim 1, wherein the shorting switch circuit comprises:
   a first LDFET and a second LDFET, the first LDFET having a source node coupled to a source node of the second LDFET; and
   the capacitively coupled gate driver circuit coupled to gates of each of the first and second LDFETs.

7. The analog multiplexer of claim 1, further comprising an analog-to-digital converter sampling circuit coupled to the first and second differential outputs.

8. The analog multiplexer of claim 1, in combination with a plurality of batteries coupled together in a series configuration wherein the level shifting switch circuit is coupled to an end battery in the series connected batteries and each remaining input switch circuit s coupled to a respective node either between a pair of adjacent batteries or at a last battery of the plurality of batteries.

9. The analog multiplexer of claim 1, wherein the shorting switch circuit for shorting the first differential output to the second differential output comprises:
   a plurality of laterally diffused field effect transistors (LDFETs), a first LDFET of the plurality of LDFETs having a drain coupled to a first voltage node and a source coupled to a source of a second LDFET of the plurality of LDFETs, a drain of the second LDFET coupled to a second voltage node; and
   a gate driver circuit coupled to gates of the first and second LDFETs, the gate driver circuit comprising:
   a voltage selector circuit having inputs coupled to the first and second voltage nodes;
   a voltage drop element coupled between an output of the voltage selector circuit and a gate output;
   a control signal capacitively coupled to the gate output; and
   a current source coupled between the gate output and a supply node.

10. The analog multiplexer of claim 9, wherein the voltage drop element comprises a diode having an anode coupled to the output of the voltage selector circuit and a cathode coupled to the gate output.

11. The analog multiplexer of claim 9, wherein the voltage selector circuit is configured to output the lowest of a first voltage on the first voltage node or a second voltage on the second voltage node.

12. The analog multiplexer of claim 1, wherein the level-shifting switch circuit comprises:
   a current level shifting circuit coupled to an input voltage node and the upper supply voltage, the circuit further comprising a set input, a reset input, an elevated ground, and a gate output;
   a transistor having a source coupled to the input voltage node, a drain coupled to an output voltage node, and a gate coupled to the gate output;

a voltage drop element coupled between the upper supply voltage and the elevated ground of the current level shifting circuit;

a first current source coupled between the elevated ground and a lower supply voltage;

a first switch coupled between the set input and a second current source; and a second switch coupled between the reset input and the second current source, wherein the second current source is further coupled to the lower supply voltage.

13. The analog multiplexer of claim 12, wherein the transistor is a laterally diffused field effect transistor (LDFET).

14. The analog multiplexer of claim 12, wherein the voltage drop element comprises a plurality of diodes coupled in series configuration wherein an anode of first diode is coupled to the upper supply voltage and a cathode of a second diode is coupled to the elevated ground.

15. The analog multiplexer of claim 12, wherein the current level shifting circuit is configured to generate a gate voltage that turns on the transistor in response to a current on the reset input.

16. The analog multiplexer of claim 12, wherein the current level shifting circuit is configured to generate a gate voltage that turns off the transistor in response to a current on the set input.

17. A method for sampling an input voltage capable of having a higher voltage level than an upper supply voltage, the method comprising:

activating a level shifting switch circuit between a first input voltage node and a first differential output terminal wherein the first input voltage node comprises the input voltage having a higher voltage level than the upper supply voltage;

activating an input switch circuit between a second input voltage node and a second differential output terminal; and shorting the first differential output terminal to the second differential output terminal after sampling of the input voltage.

18. The method of claim 17, further comprising:

sequentially activating different pairs of input switch circuits of a plurality of input switch circuits such that a voltage on the first differential output terminal is higher than a voltage on the second differential output terminal at a first time and the voltage on the second differential output terminal is higher than the voltage on the first differential output terminal at a second time responsive to activation of different combinations of pairs of input switch circuits.

19. The method of claim 18, further comprising converting a differential voltage at the first and second differential output terminals to a digital representation.

20. An analog multiplexer for sampling an input voltage capable of having a higher voltage level than an upper supply voltage of the multiplexer, the multiplexer comprising:

a plurality of input switch circuits, each input switch circuit coupled between a respective input and one of a first or a second differential output, at least one of the plurality of input switch circuits comprising a level shifting switch circuit configured to sample the input voltage capable of having the higher voltage level than the upper supply voltage; and means for shorting the first differential output to the second differential output after the input voltage is sampled.

* * * * *

UNITED STATES PATENT AND TRADEMARK OFFICE
CERTIFICATE OF CORRECTION

PATENT NO. : 10,200,041 B2
APPLICATION NO. : 15/340423
DATED : February 5, 2019
INVENTOR(S) : Gorbold et al.

Page 1 of 1

It is certified that error appears in the above-identified patent and that said Letters Patent is hereby corrected as shown below:

On the Title Page

In item (71), in "Applicants", in Column 1, Lines 1-7, delete "Applicants: Jeremy R. Gorbold, Newbury (GB); Christian Steffen Birk, Bandon (IE); Gerard Mora Puchalt, Catarroja (ES); Colin Charles Price, Berks (GB); Michael C. W. Coln, Lexington, MA (US); Mahesh Madhavan Kumbaranthodiyil, Kerala (IN)" and insert --Applicant: Analog Devices Global, Hamilton (BM)-- therefor In item (72), in "Inventors", in Column 1, Line 3, delete "Mora Puchalt," and insert --Mora-Puchalt,-- therefor In the Claims In Column 15, Line 45, in Claim 1, delete "outputs;" and insert --outputs,-- therefor In Column 15, Line 56, in Claim 2, delete "signal;" and insert --signal,-- therefor In Column 16, Line 29, in Claim 8, delete "s" and insert --is-- therefor Signed and Sealed this
Twenty-fifth Day of June, 2019

Andrei Iancu
*Director of the United States Patent and Trademark Office*